US012566192B1

(12) United States Patent
Tsironis

(10) Patent No.: US 12,566,192 B1
(45) Date of Patent: Mar. 3, 2026

(54) AUTOMATED MULTI-BAND TUNING PROBE SYSTEM

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 127 days.

(21) Appl. No.: 18/617,121

(22) Filed: Mar. 26, 2024

(51) Int. Cl.
*G01R 1/067* (2006.01)
*G01R 31/28* (2006.01)

(52) U.S. Cl.
CPC ..... *G01R 1/06772* (2013.01); *G01R 31/2822* (2013.01)

(58) Field of Classification Search
CPC .. H03H 7/40; G01R 31/2822; G01R 1/06772; G01R 1/26; G01R 27/28
USPC ..................................... 324/754.06
See application file for complete search history.

(56) References Cited

U.S. PATENT DOCUMENTS

| | | | |
|---|---|---|---|
| 6,980,064 | B1 | 12/2005 | Boulerne |
| 8,098,112 | B2 | 1/2012 | Simpson |
| 8,358,186 | B1 | 1/2013 | Tsironis |
| 9,252,738 | B1 | 2/2016 | Tsironis |
| 9,276,551 | B1 * | 3/2016 | Tsironis .................... H03J 3/00 |
| 9,625,556 | B1 | 4/2017 | Tsironis |
| 10,693,208 | B1 * | 6/2020 | Tsironis ................. G01R 27/04 |
| 12,111,347 | B1 * | 10/2024 | Tsironis ............. G01R 1/06772 |

OTHER PUBLICATIONS

"Load Pull" [online] Wikipedia, [Retrieved on Aug. 24, 2017]. Retrieved from Internet <URL: https://en.wikipedia.org/wiki/Load_pull>.
"Computer Controlled Microwave Tuner—CCMT", Product Note 41, Focus Microwaves Inc., Jan. 1998.
"Active Load Pull" [online] bsw TestSystems & Consulting [Retrieved on Mar. 7, 2024]. Retrieved from Internet <URL: https://www.bsw-ag.com/en/solutions-impdance-adaptations-active-load-pull.html>.

* cited by examiner

*Primary Examiner* — Roberto Velez

(57) ABSTRACT

Multi-band remotely configurable tuning probes for slide screw impedance tuners allow instantaneous larger frequency coverage beyond the capacity of existing tuning probes using the single horizontal and vertical axis mechanism of a prior art single probe, single band tuner. This is done by carving multiple slugs of different length and frequency coverage as segments of a disc-shaped revolving slab, which rotates inside the legs of a captive unit and locks at distinct angles. The captive unit is attached to the vertical control mechanism of the tuner and rotation is ensured using multiple traverse lateral studs on the disc unit and a set of vertical studs on the slabline close to the idle port of the tuner. An automated procedure ensures remote switching between tuning slugs. Calibration and tuning is as in prior art single probe tuners.

9 Claims, 13 Drawing Sheets

AUTOMATED MULTI-BAND TUNING PROBE SYSTEM

PRIORITY CLAIM

Not Applicable

CROSS-REFERENCE TO RELATED ARTICLES

1. "Load Pull" [online] Wikipedia, [Retrieved on 2017 Aug. 24]. Retrieved from Internet <URL: https://en.wikipedi-a.org/wiki/Load_pull>.
2. "Computer Controlled Microwave Tuner, CCMT", Product Note 41, Focus Microwaves Inc. 1998, pages 2-4.
3. Tsironis, C. U.S. Pat. No. 8,358,186, "Impedance Tuners with Resonant Probes".
4. Boulerne, P. U.S. Pat. No. 6,980,064, "Slide-screw Tuner with Single Corrugated Slug".
5. Simpson, G. U.S. Pat. No. 8,098,112, "Impedance Tuner Systems and Probes".
6. Tsironis, C. U.S. Pat. No. 9,252,738, "Wideband Tuning Probes for Impedance Tuners and Method".
7. Tsironis, C. U.S. Pat. No. 9,625,556, "Method for Calibration and Tuning with Impedance Tuners".
8. "Active Load Pull" [online] bsw TestSystems & Consulting [Retrieved on 2024 Mar. 7]. Retrieved from Internet <URL: https://www.bsw-ag.com/en/solutions-impdance-adaptations-active-load-pull.html>

BACKGROUND OF THE INVENTION

This invention relates to general microwave testing and in particular to testing of a device under test (DUT), for example microwave transistors in the high frequency (typically Gigahertz (GHz) range) domain using Load Pull (see ref. 1). Load Pull is a measurement method whereby the load impedance presented to the DUT at a given frequency is changed systematically and the DUT performance is registered, with the objective to find an optimum embedding (matching) network for obtaining the design objectives, which may be maximum gain, power, efficiency, linearity or else.

PRIOR ART

A popular method for testing and characterizing medium to high-power microwave transistors is called "load-pull" and uses appropriate test setups (FIG. 1), see ref. 1. Low noise transistors are tested using "source-pull". Load or source pull use impedance tuners 2, 4 (see ref. 2) and other test equipment, such as signal or noise sources 1, test fixtures housing the DUT 3, and power meters or low noise receivers 5, the whole controlled by a computer 6; the computer controls and communicates with the tuners 2, 4 and the other test equipment 1, 5 using digital cables 7, 8, 9. The tuners are used in order to manipulate the microwave impedance conditions presented to the tested DUT in a systematic and controlled manner (see ref. 1); impedance tuners allow determining the optimum impedance conditions of, to be designed and made, embedding networks for designing amplifiers and other microwave components for specific performance targets, such as noise figure, gain, efficiency, intermodulation etc. For devices in chip-form, tested preferably on-wafer (see ref. 5), the insertion loss between the DUT and the tuner reduces the effective reflection factor I LOAD at the DUT reference plane. The only method to increase the reflection factor in a passive load pull system i.e. a system not using active feedback signal injection (see ref. 8) is increasing the reflection factor of the tuner. Since the tuning probe 34 is capacitively coupled with the center conductor 33, this means increasing the maximum controllable capacitance by increasing the surface between the probes and the center conductor and decreasing the gap between tunning probe (slug) and center conductor, which is possible if extremely high precision vertical mechanical control is available (the gaps to be controlled are of the order of 20-40 µm) while avoiding a short circuit, only by increasing its horizontal length 37. Various types of resonant or combination tuning probes, including one or more slugs, have been reported before (see ref. 3, 4, 5 and 6); however, none includes a configurable revolving tuning probe assembly to enhance the envelope of tuner frequency coverage, controlled using the existing horizontal and vertical movement control of a single probe tuner.

BRIEF DESCRIPTION OF THE INVENTION

The objective of this invention is a remotely configurable tuning probe system for single vertical axis slide screw impedance tuners covering multiple frequency bands and allows larger overall frequency coverage beyond the capacity of each individual tuning probe (slug), using only the single horizontal and vertical axis movement control mechanisms of existing single probe, single frequency band tuners. This is done by combining several tuning slugs of different length into a revolving tuning assembly, the slugs being created as segments of a revolving disc and controlled by the same mobile tuner carriage using the single vertical axis mechanism of a single probe tuner, as shown in FIG. 4: this device (a) allows larger maximum to minimum frequency coverage, (b) can replace existing tuning probes in existing tuners without additional remote-control and (c) can use existing tuner calibration and data processing routines, (see ref. 7) all this effected with minimum cost and without requiring critical structural modification to existing tuners, additional internal remotely controlled mechanisms and/or external manual intervention.

DETAILED DESCRIPTION OF THE DRAWINGS

The invention and its mode of operation will be better understood from the following detailed description when read with the appended drawings in which.

DETAILED DESCRIPTION OF PRIOR ART LEADING TO THE INVENTION

Figure 1:
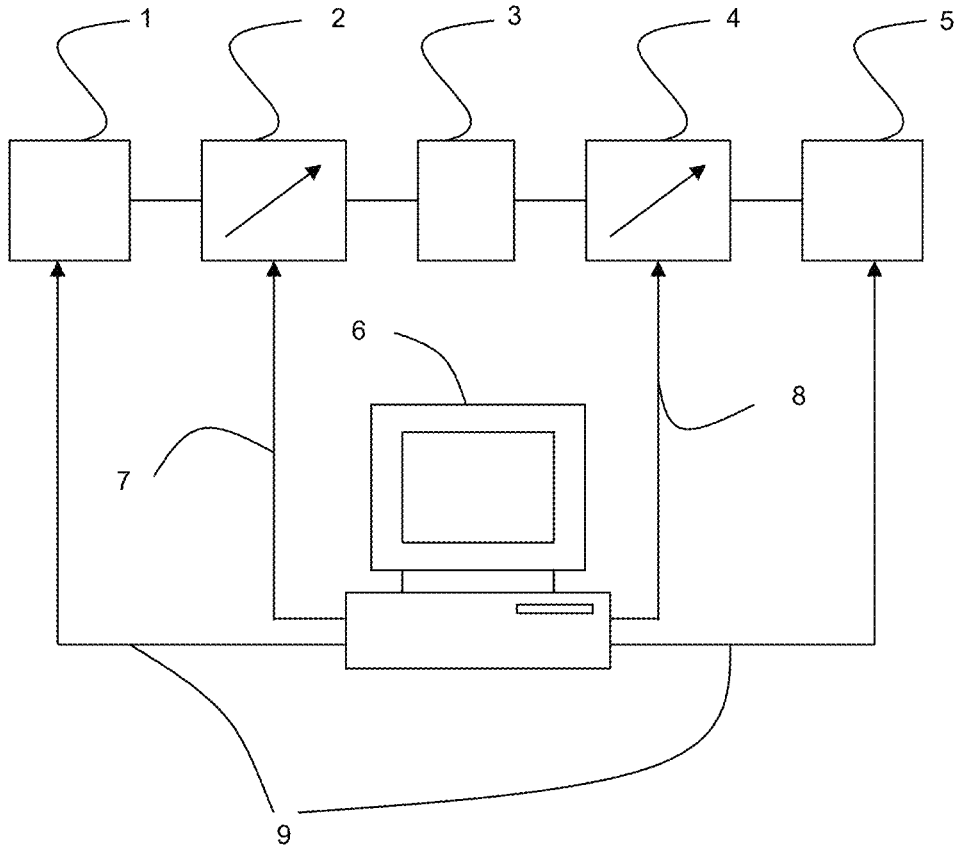
FIG. 1 depicts prior art, a typical scalar (measuring amplitude only) load pull test system using pre-calibrated passive tuners.
Figure 2:
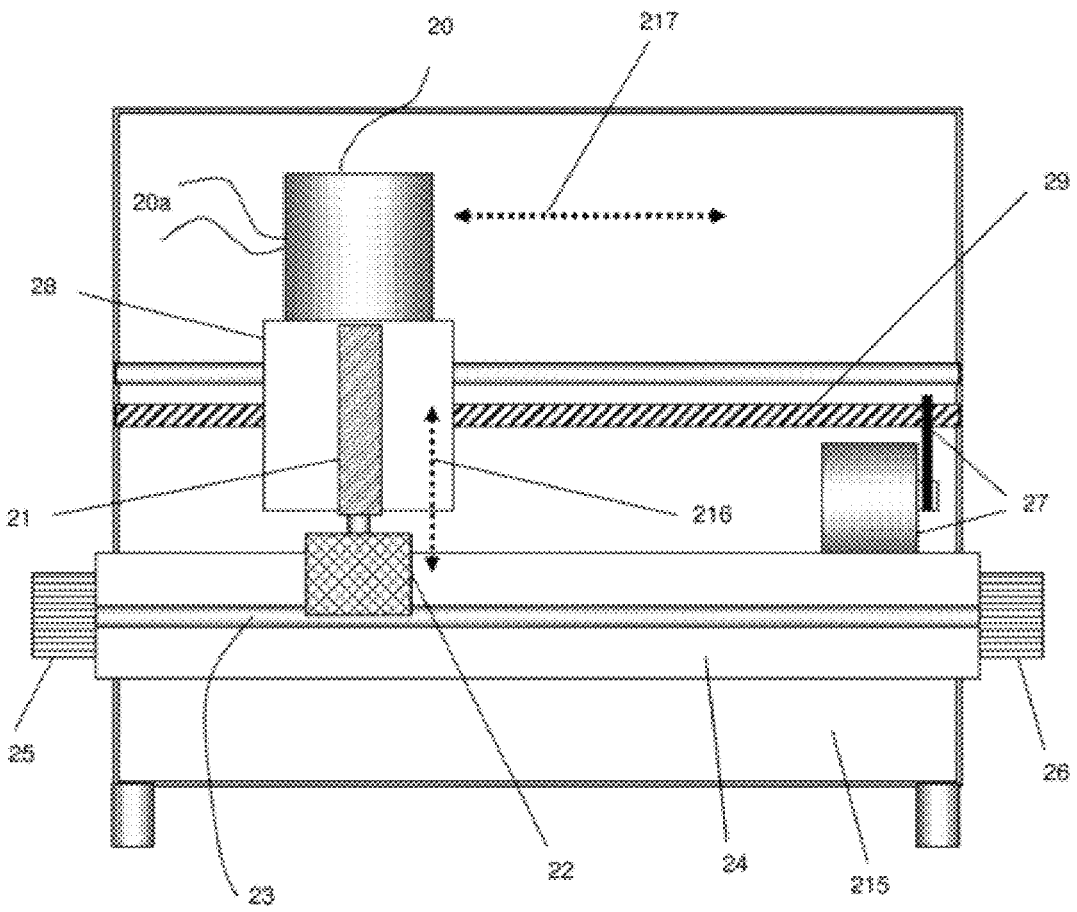
FIG. 2 depicts prior art, a schematic front view of a passive slide screw load pull tuner.

A typical slide screw tuner is shown in FIG. 2: it includes a slabline 24 with a center conductor 23, a test port 25 and an idle port 26. Inside the tuner housing 215 there is a mobile carriage 28 traveling 217 along the slabline, driven by specific gear 27, in this case a screw 29 and a stepper motor; stepper motors 20 are generally used in this type of device, because they offer the most effective (cost versus size and accuracy) solution of mechanical positioning; in the carriage 28, there is a highly precise high resolution vertical axis mechanism 21 moving a tuning probe (slug) 22 perpendicular towards and away 216 from the slabline; the slug is capacitively coupled with the center conductor 23 and creates an adjustable signal reflection corresponding to the microwave impedance to be presented to the DUT. The vertical axis mechanism 21 and the slug 22 are controlled by a second vertical stepper motor 20 which is also remotely controlled 20*a*. It is this type of established, proven tuner technology, this invention uses and enhances by introducing the new combination tuning probe.

Figure 3:
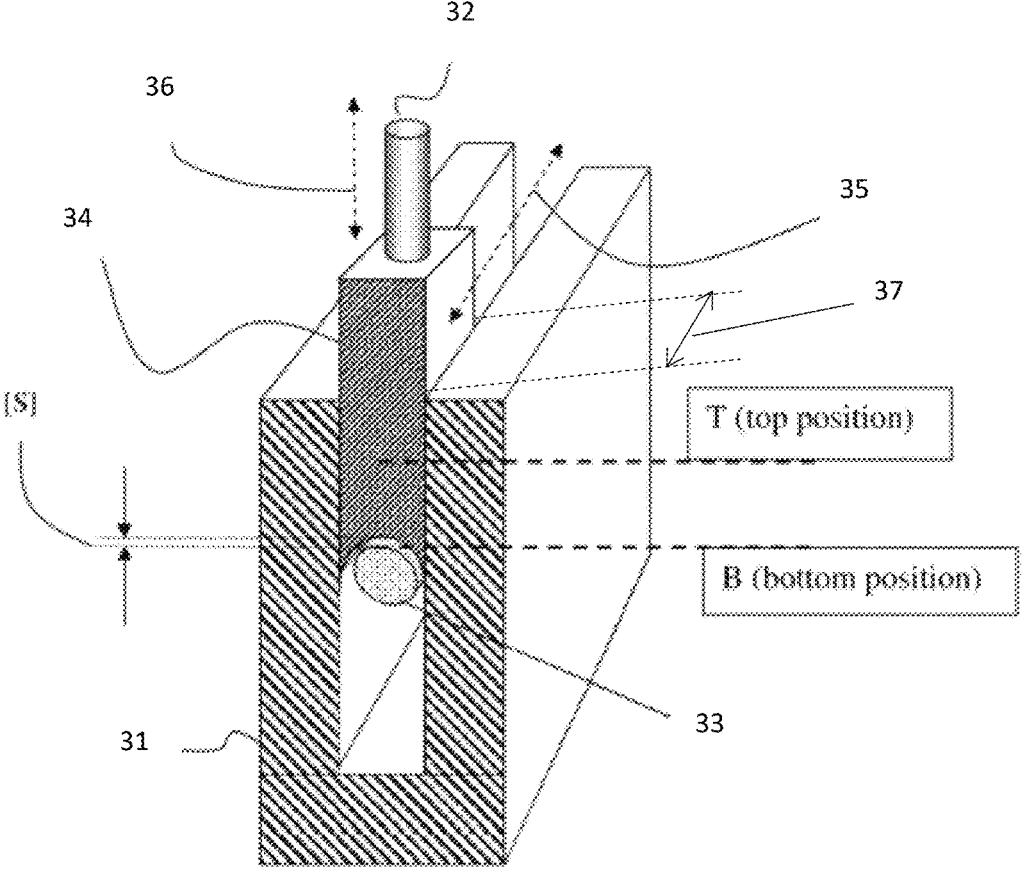
FIG. 3 depicts prior art, a perspective view of a metallic reflective tuning probe (slug).

The typical prior art tuning probe (slug) is shown in FIG. 3: it includes a body 34 and has a concave bottom mirroring the profile of the (typically cylindrical) center conductor 33 of the slabline 31 and a holding stud 32 to be attached to the vertical axis mechanism 21. The slug moves vertically 36 and horizontally 35 controlled by the axis mechanism 21 and the carriage 28. Vertically it moves between a top position T and a bottom position B leaving a small gap [S] to avoid a short circuit. The length 37 of the parallelepiped slug is defined along the axis of the slabline, the thickness is defined perpendicular to the axis of the slabline. The tuners can be used flat on the bench or inclined on a wafer probe station to match the angle of the wafer probe and optimize the interconnection between tuner and wafer probe. For this reason, the traditional terms "horizontal" and "vertical" do not always apply readily; however, for the scope of this disclosure and for simplification, horizontal means along or parallel to the tuner slabline and its center conductor, and vertical means perpendicular to the axis of the slabline and center conductor. In any case the predominant item is the center conductor.

Figure 4:
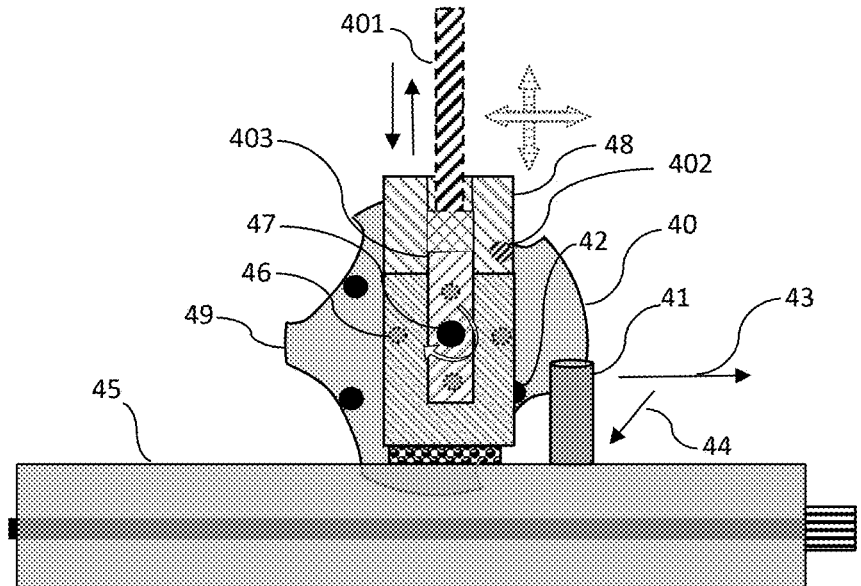
FIG. 4 depicts a vertical cross section of the configurable tuning probe system comprising a tuning segment of the disc (40) and more (slugs, 40, 49 . . . ), the vertical axis (401) and, in the background, the leg (403) of the saddle unit (48).
Figure 5:
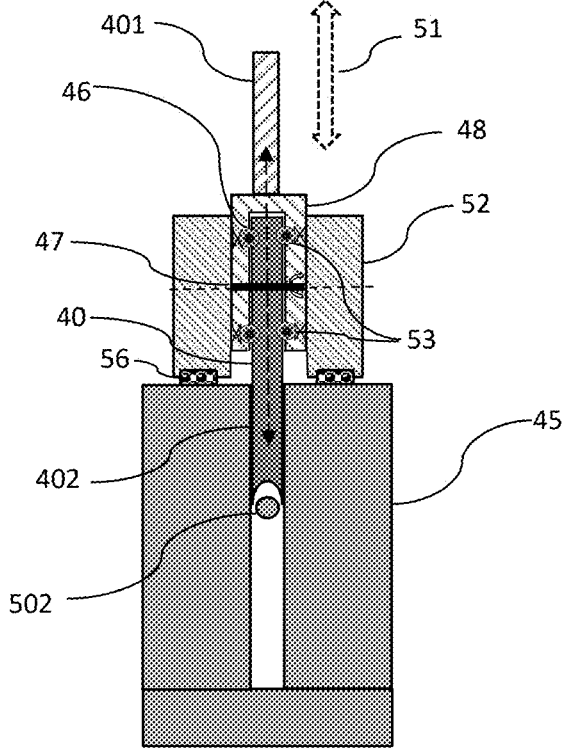
FIG. 5 depicts a cross section of the and the vertical locking mechanism of the tuning probe system perpendicular to the slabline of the tuning assembly.

The new tuning probe system is shown in FIGS. 4 and 5: the disc-shaped slab 40 rotates around the center 47 when the horizontal movement 43 of the carriage 48 along the slabline 45 and the disc-stud 42 hits on the slabline-stud 41 and causes the disc-shaped slab 40 to rotate as shown by arrow 44 and move the segment 40 towards the slabline 45. To move the segment 49 towards the slabline 45, the axis 401 shall be lifted, so that stud 42 is higher than stud 41, the carriage 48 must be moved opposite than arrow 43, then the axis 401 be lowered until the hidden stud 402 can catch behind stud 41 and rotate the disc-shaped slab 40 opposite than arrow 44. This is possible, since, after the first rotation of segment 40 towards the slabline, hidden stud 402 will be at the position of stud 42. If one movement is not enough the "lift-move-lower-move" procedure is repeated until the desired segment faces the slabline vertically. Each time a new segment is in place, the steel balls embedded in the saddle unit 403 hop and fall into the troughs 46 and secure the orientation angle of the disc, in a way that the assembly now behaves like a single jitter-free tuning slug.

FIG. 5 shows a front view of the configurable tuning probe assembly; we see the tuning slug 40 in profile, sliding 402 between the walls of the slabline 45, attached to the vertical axis mechanism using pin 401 and moved vertically 51 towards or away from the center conductor 502; the mobile carriage 52 rolls smoothly on top of the slabline using ball sliders 56; the saddle unit 48 holds the disc-shaped slab 40 at the rotation center 47 and locks its angle using the spring pre-loaded steel balls 53 (FIG. 6), which drop into the troughs 46 which are machined into the disc-shaped slab.

Figure 6:
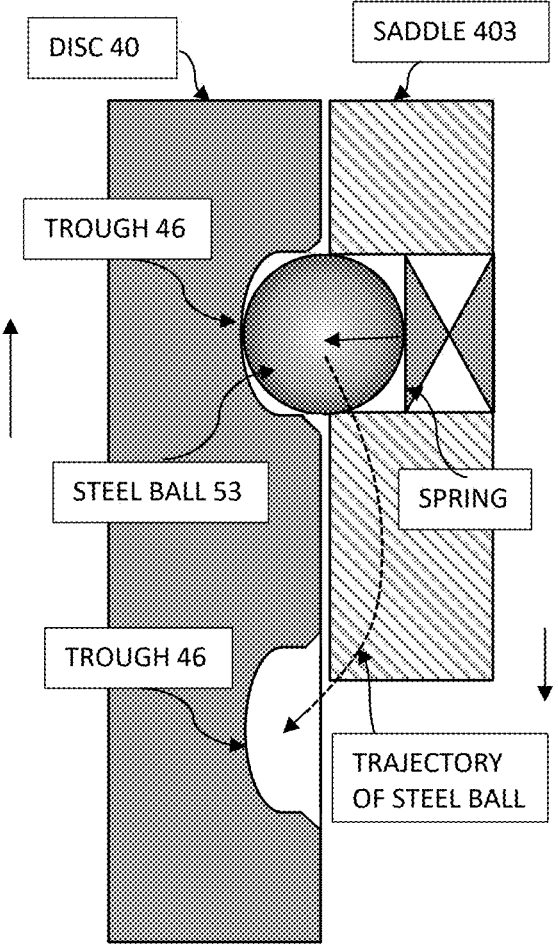
FIG. 6 depicts the steel ball locking detail of the locking mechanism.

FIG. 6 is a self-explaining view of the locking mechanism. The steel ball 53 is spring pre-loaded and hops from one trough 46 to the next when the disc 40 moves (rotates) against the saddle unit 48 following the indicated trajectory.

Figure 8:
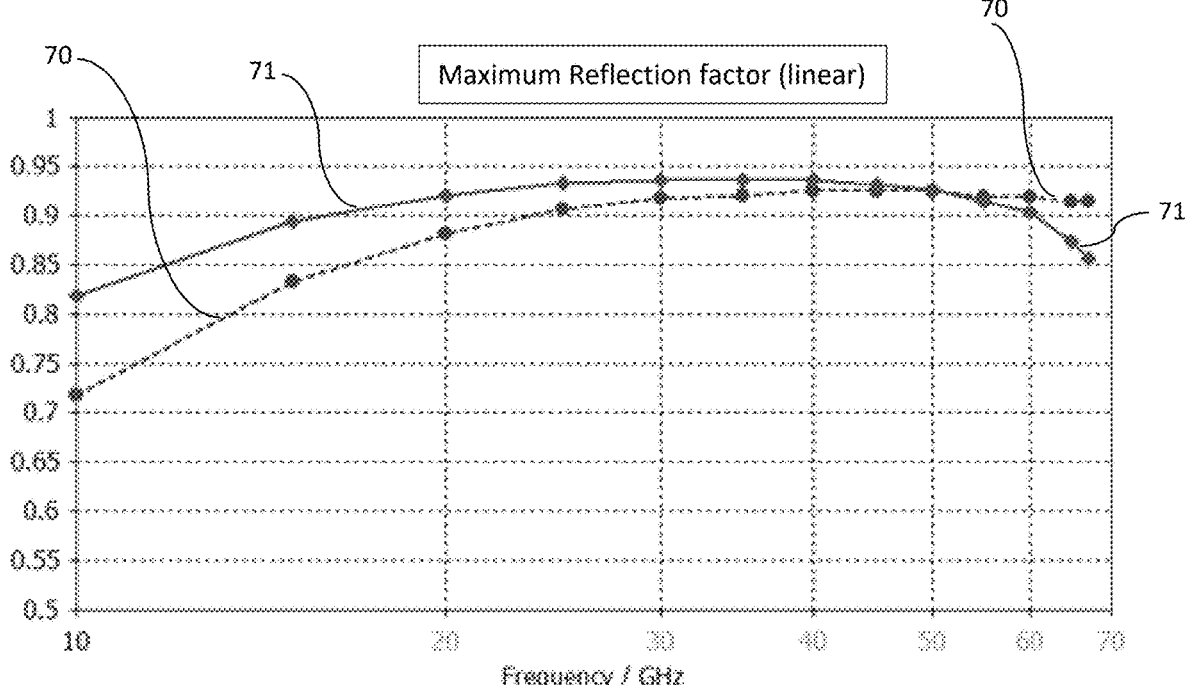
FIG. 8 depicts the frequency response of the two types of tuning slugs as in FIG. 7.

The shape of the concave bottom of the tuning slugs affects the frequency response of the unit. The bottom can be machined straight (item 71) or left round/oval (item 70); the effective tuning area 73 (which is only part of the total slug length 72) or 74 of slugs with the same overall horizontal length 74 affects the response; this is shown in FIG. 8: the rounded slugs 70 lack low frequency reflection but extend to higher frequencies; the flat slugs create more low frequency reflection but fall off faster at high frequencies.

Figure 9:
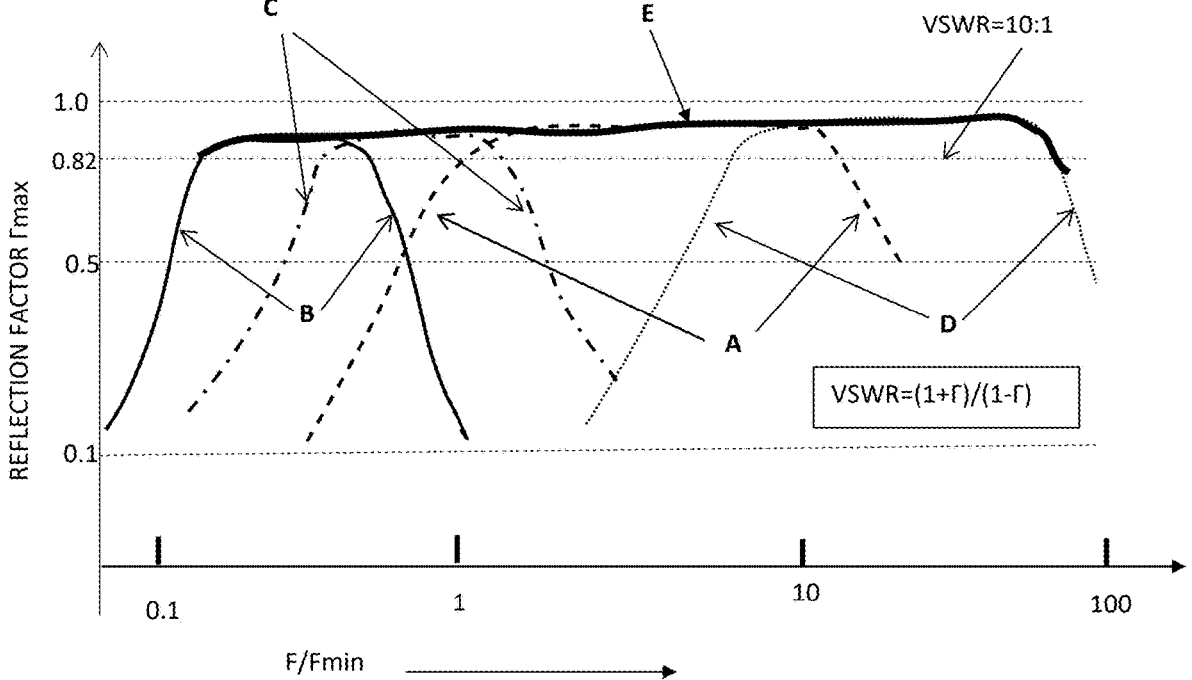
FIG. 9 depicts schematically the overlapping and typical maximum reflection factor of the possible probe angular settings created by the various tuning slugs.

The benefit of the configurable synthetic tuning probe of FIG. 4 is shown in FIG. 9: the overall frequency coverage of the tuner using a single vertical axis and the associated simpler mechanics and control electronics is several times larger than the coverage of prior art probes: a prior art probe covers a single one of the traces, A to D; the combination probe disclosed here covers all traces A+B+C+D, shown as envelope trace E, of course not simultaneously, but one at a time. To do that with traditional tuning probes the tuner should have four mobile carriages, vertical axes, control electronics etc. This is obviously a significant benefit of the invention. Beyond that, the fact that once configured the tuner is calibrated and used as traditional tuners (see ref. 7) offers the solution the benefit of established and thoroughly known debugged technology.

Figure 10:
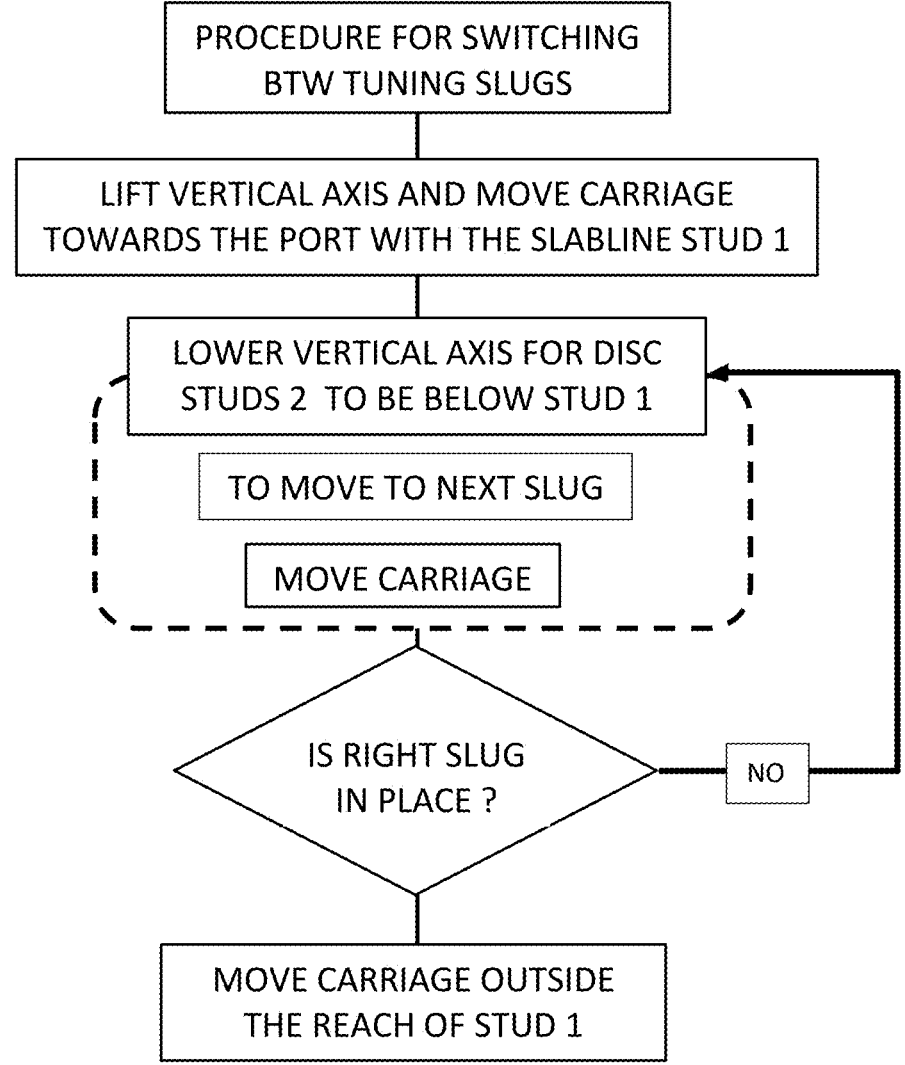
FIG. 10 depicts the flow chart of the procedure for changing slugs and frequency bands.

The automated procedure of configuring the combination tuning probe is visualized in the flowchart of FIG. 10: when instructed to, the vertical axis is lifted to maximum height and the carriage moved in the area of the idle port (we chose the idle port because any mechanical intervention at the test port, would increase the wasted space between the DUT and the tuning slug and the associated insertion loss would reduce the maximum reflection factor, especially at higher frequencies); once in the area and, depending on the next tuning slug to be activated, the vertical axis is lowered for a first stud 42 to be lower than the permanent stud 41 and the carriage is moved either towards the idle port or away from it for the disc-shaped slab to rotate clock- or anti-clock direction. If the rotation is not enough then the vertical axis is lifted, the carriage returned to its previous position and the procedure is repeated until the desired slug is locked in. Because the overall geometry including the position of the carriage, the vertical axis and the position and size of the studs are known, this procedure can be pre-programmed and executed automatically; any CNC machine works like that.

Figure 7:
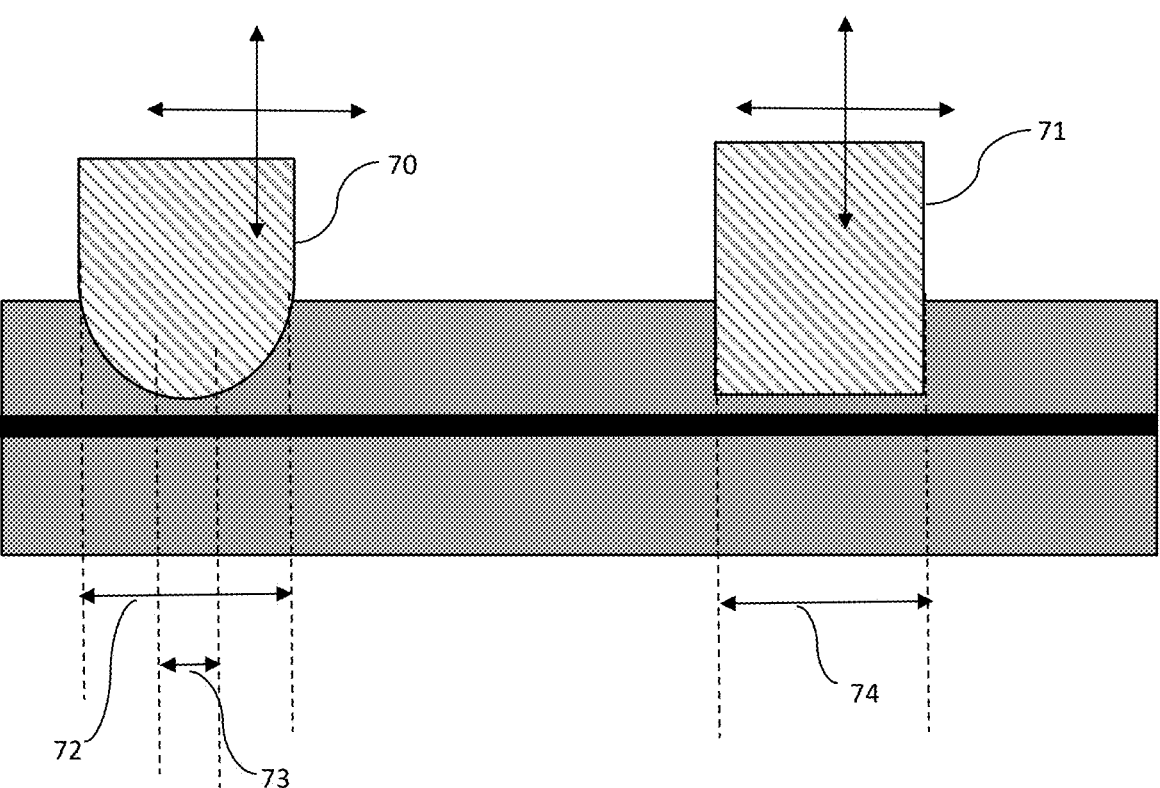
FIG. 7 depicts profiles of two types of tuning slugs, an oval or round one (70) and a rectangular one (71).
Figure 11:
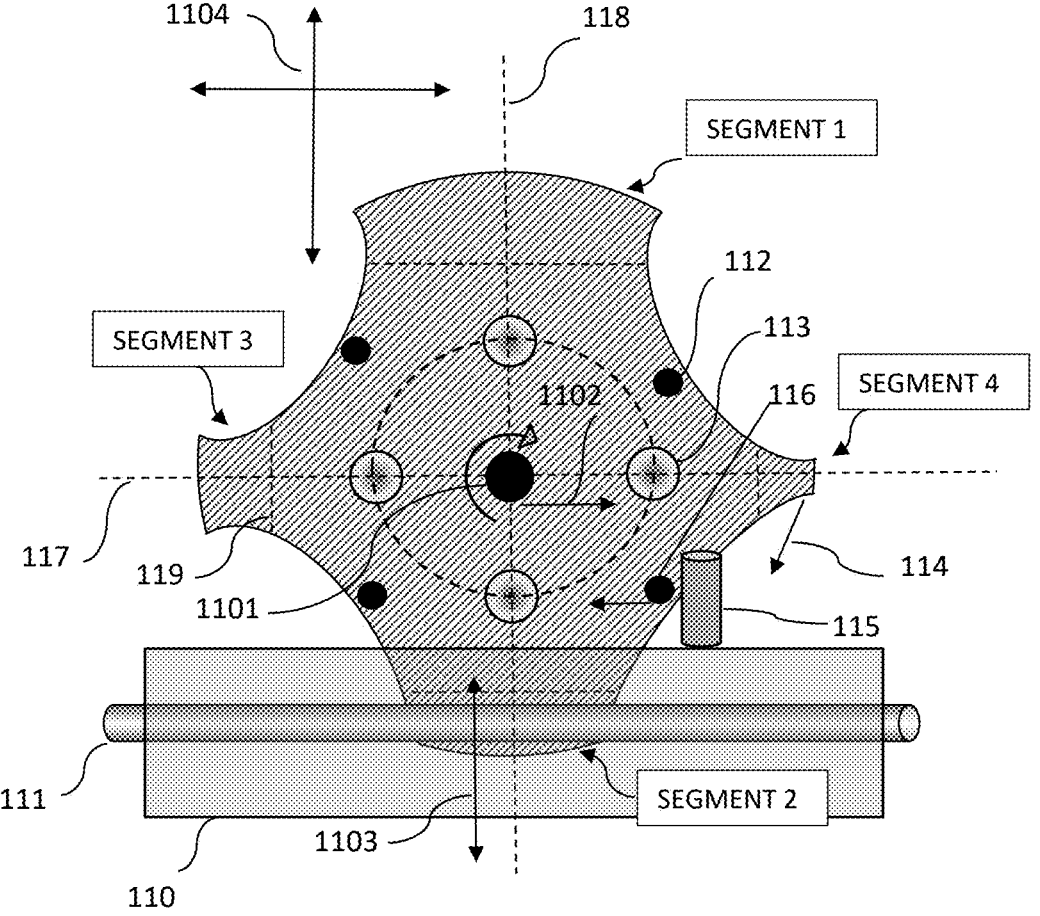
FIG. 11 depicts details and definitions used to describe the segmented disc-shaped tuning slab.

FIG. 11 summarizes the design and definitions of the synthetic combination tuning probe: at first the term "segment" is defined. The disc-shaped slab including segments 1 to 4 is controlled horizontally and vertically 1104 and may rotate around a center 1101; when lowered enough 1103 the disc mounted stud 116 will be below the slabline mounted stud 115, in which case, when the (not shown) carriage moves the disc-shaped slab as shown by arrow 1102, the stud 116 will hit on stud 115 and cause the disc to rotate as shown by arrow 114 and move segment 4 towards the slabline 110; if the actual horizontal movement is not enough (this depends on the total number and angular distance of the segments from each other) then the axis-lifting-carriage-moving 1103-1102 procedure is repeated and a new stud, like 112 is used to keep rotating the disc. The bottom of the tuning slugs facing the center conductor 111, here indicated by trace 119, can be round, oval or straight or a combination of (FIGS. 7 and 8) depending on the objectives of the design. The whole mechanism must be secured using the troughs 113 aligned with the steel balls 53 in the saddle unit 48. In the case of four segments as shown here the troughs must be aligned as shown by axes 117 and 118.

Figure 12:
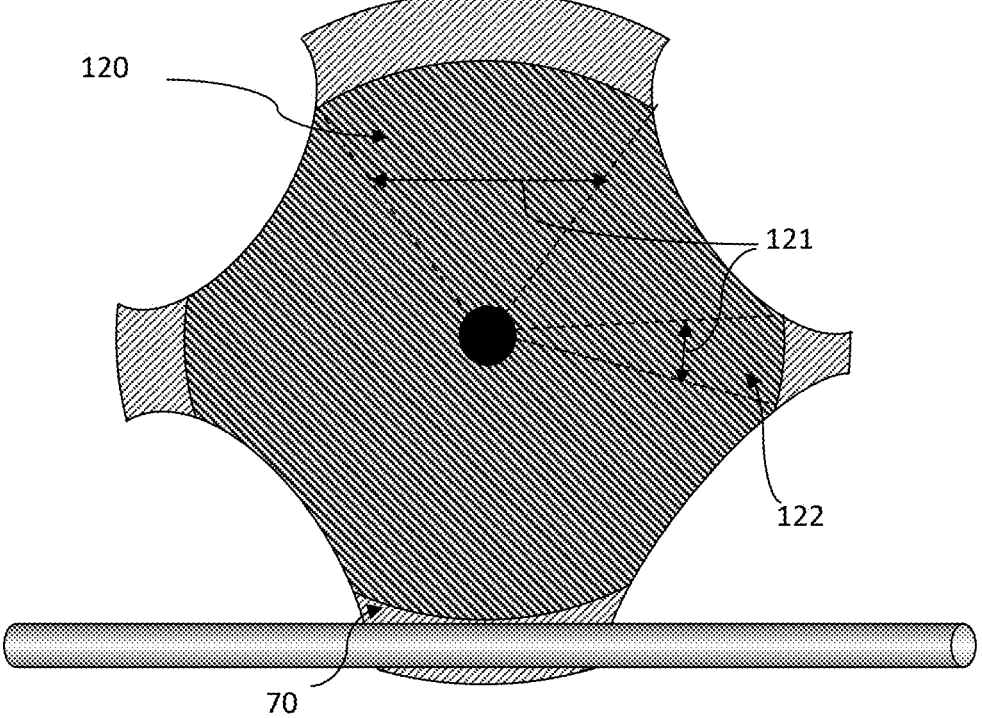
FIG. 12 depicts the definition of the opening angle of the tuning segments.
Figure 13:
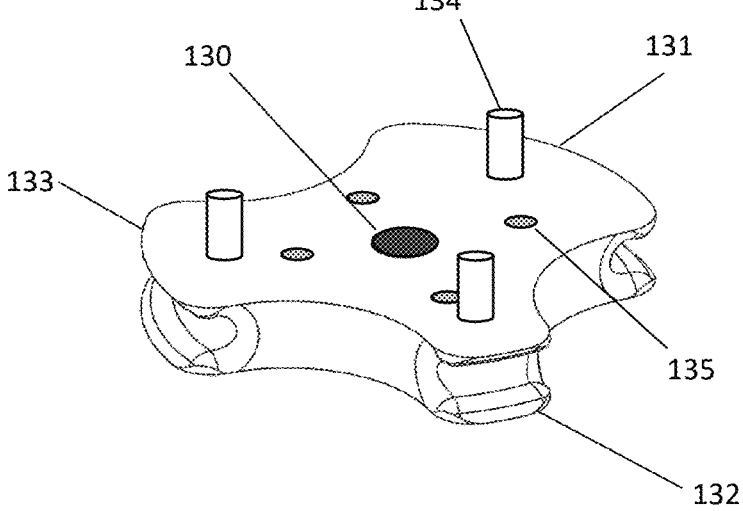
FIG. 13 depicts a 3D view of a disc-shaped tuning slab with three segments.

The angular opening of the segments is defined in FIG. 12 for a four-segment disc-shaped slab, as shown by arrows 121 of segments 120 and 122; in this case the concave bottom at the periphery is shown round (70). FIG. 13 shows a perspective view of a three-segment disc-shaped tuning slab. The controlling studs 134 on the slab are visible as well as the periphery 131/133 and the concave shape 132 of the periphery, together with the rotation center 130 and the aligned troughs 135 that help to lock the rotation angles of the disc.

The present invention discloses a configurable tuning probe system for single vertical axis load pull tuners, allowing operation in multiple frequency bands, whereby allowing widening the instantaneous frequency bandwidth of the tuner, without the need for additional electronic and mechanical gear and remote control; a long, a short and a number of medium size slugs are possible in one automatically reconfigurable revolving assembly. Obvious alternatives shall not impede the originality of the idea.

What is claimed is:

1. An automatically configurable multi-band tuning probe system for load pull tuner,
wherein
the load pull tuner comprises a slabline with two parallel conductive sidewalls and a cylindrical center conductor linking two ports, a test port, and an idle port, and at least one remotely controlled mobile carriage, moving along the slabline, and including a single, remotely controlled, perpendicular to the slabline vertical axis mechanism which holds and controls a remotely configurable multi-band tuning probe assembly;
and wherein
the remotely configurable multi-band tuning probe assembly comprises:
a) a configurable tuning probe linked to the vertical axis mechanism and two components:
a1) a saddle device, which is connected to the vertical axis and has two legs forming a bridge across a channel along the slabline, and
a2) a disc-shaped slab with a thickness, a front, and a back surface, divided in a multitude of angular segments forming tuning slugs and rotating between the legs of the bridge parallel to the slabline, insertable and slidably-fitting between the sidewalls of the slabline and lockable at distinct rotation angles using an interlock mechanism and
b) means for remotely controlling the rotation and locking angles of the disc-shaped slab using an unmovable control device and an automated configuration procedure.

2. The automatically configurable multi-band tuning probe system of claim 1
wherein
the tuning slugs formed by the angular segments of the rotating disc-shaped slab have concave peripheral extremity mirroring the center conductor and covering different frequency bands each.

3. The automatically configurable multi-band tuning probe system of claim 2
wherein
the angles of the segments are selected to create tuning slugs, each slug covering a frequency band; the said tuning bands being adjacent, covering a totality of frequencies from a minimum frequency to a maximum frequency, the smallest segment angle creating a highest frequency band and the largest segment angle creating a lowest frequency band.

4. The automatically configurable multi-band tuning probe system of claim 1,
wherein
the disc-shaped slab has a multitude of stud sets placed concentrically traversing and protruding from the front and back surface,
and a set of two vertical studs mounted symmetrically across each-other on top of the walls of the slabline close to the idle port;
and wherein
the disc-shaped slab rotates sliding between the legs of the bridge and is lockable, using the interlock mechanism, at several angles associated with orientation of the segments versus the slabline.

5. The automatically configurable multi-band tuning probe system of claim 4,
wherein
the set of two vertical studs on top of the sidewalls of the slabline are mounted at a distance across each other more than the thickness of the disc-shaped slab and less than the said thickness plus the protrusion of the studs traversing the disc-shaped slab.

6. The automatically configurable multi-band tuning probe system of claim 5 comprises the following steps:
a) lift the vertical axis mechanism to a highest position;
b) move the at least one remotely controlled carriage towards the idle port associated with the set of two vertical studs on the slabline;
c) lower the vertical axis mechanism until the multitude of studs sets on the disc-shaped slab are below the set of two vertical studs on the slabline;
d) move the at least one remotely controlled carriage towards the test port or the idle port to rotate the disc-shaped slab, switch and lock at the next frequency band;
e) if the frequency band locked in step d) is the desired one, go to step g);
f) if the frequency band locked in step d) is not the desired one lift the vertical axis mechanism to the highest position, move the at least one remotely controlled carriage back and go to step c);
g) lift the vertical axis mechanism to the highest position and initialize the load pull tuner.

7. The automatically configurable multi-band tuning probe system of claim 6, wherein after the automated configuration procedure, the disc-shaped slab remains locked against the legs of the bridge while the at least one remotely controlled mobile carriage and the vertical axis mechanism move horizontally and vertically.

8. The automatically configurable multi-band tuning probe system of claim 1 or 4 employing a set of troughs on the front and back surfaces of the disc-shaped slab and associated spring-loaded steel balls installed on both legs of the bridge and protruding inwards facing the disc-shaped slab, mirroring, when aligned, the set of troughs;

wherein when aligned, the steel balls drop into the troughs and lock the disc-shaped slab at a certain angle and secure the orientation of the segment.

9. The automatically configurable multi-band tuning probe system of claim 1, wherein the vertical axis mechanism and the horizontal position of the at least one remotely controlled mobile carriage of the load pull tuner are remotely controlled using stepper motors and gear.

\* \* \* \* \*